US011378610B2

(12) United States Patent
Mochizuki et al.

(10) Patent No.: US 11,378,610 B2
(45) Date of Patent: Jul. 5, 2022

(54) INSPECTION SYSTEM AND TEMPERATURE MEASURING METHOD FOR INSPECTION SYSTEM

(71) Applicant: TOKYO ELECTRON LIMITED, Tokyo (JP)

(72) Inventors: Jun Mochizuki, Yamanashi (JP); Yoshihito Yamasaki, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 418 days.

(21) Appl. No.: 16/613,376

(22) PCT Filed: Mar. 1, 2018

(86) PCT No.: PCT/JP2018/007834
§ 371 (c)(1),
(2) Date: Nov. 13, 2019

(87) PCT Pub. No.: WO2018/211775
PCT Pub. Date: Nov. 22, 2018

(65) Prior Publication Data
US 2020/0174060 A1 Jun. 4, 2020

(30) Foreign Application Priority Data
May 18, 2017 (JP) .............................. JP2017-098913

(51) Int. Cl.
*G01R 31/26* (2020.01)
*G06T 7/73* (2017.01)
(Continued)

(52) U.S. Cl.
CPC .......... *G01R 31/2601* (2013.01); *G01K 11/12* (2013.01); *G01R 1/06794* (2013.01);
(Continued)

(58) Field of Classification Search
CPC ............ G01R 31/2601; G01R 1/06794; G01K 11/12; G06T 7/0004; G06T 7/73; G06T 2207/30148; G06V 10/751
See application file for complete search history.

(56) References Cited

U.S. PATENT DOCUMENTS

2017/0139002 A1\* 5/2017 Okada ................ G01R 31/2601

FOREIGN PATENT DOCUMENTS

| JP | 2001-024204 A | 1/2001 |
| JP | 2004-140241 A | 5/2004 |
| JP | 2013-254812 A | 12/2013 |

OTHER PUBLICATIONS

PCT International Search Report and Written Opinion, PCT Application No. PCT/JP2018/007834, dated May 29, 2018, 6 pages (with English translation of International Search Report).

\* cited by examiner

*Primary Examiner* — Paresh Patel
(74) *Attorney, Agent, or Firm* — Fenwick & West LLP

(57) ABSTRACT

An inspection system includes an inspection device that includes a stage on which a substrate is mounted and inspects the substrate on the stage, a temperature adjustment mechanism that adjusts the temperature of the stage, a substrate accommodating part, a temperature measurement substrate standby part that makes a temperature measurement substrate wait, a transfer unit that transfers the substrate and the temperature measurement substrate onto the stage, and a camera used for aligning the substrate on the stage. The temperature measurement substrate includes, on the surface thereof, a temperature measurement member whose state changes depending on the temperature. The transfer unit transfers the temperature measurement substrate onto the stage, the camera images the temperature measurement member, and the temperature of the tempera- (Continued)

ture measurement substrate is measured from a change in the state of the temperature measurement member.

12 Claims, 5 Drawing Sheets

(51) Int. Cl.
*G01K 11/12* (2021.01)
*G01R 1/067* (2006.01)
*G06T 7/00* (2017.01)
*G06V 10/75* (2022.01)

(52) U.S. Cl.
CPC .............. *G06T 7/0004* (2013.01); *G06T 7/73* (2017.01); *G06V 10/751* (2022.01); *G06T 2207/30148* (2013.01)

INSPECTION SYSTEM AND TEMPERATURE MEASURING METHOD FOR INSPECTION SYSTEM

TECHNICAL FIELD

The present invention relates to an inspection system for inspecting electrical characteristics of devices formed on a substrate such as a semiconductor wafer or the like, and a temperature measuring method for the inspection system.

BACKGROUND

In a semiconductor device manufacturing process, electrical characteristics of a plurality of semiconductor devices (hereinafter, simply referred to as "devices") formed on a wafer are inspected after all processes are performed on a semiconductor wafer (hereinafter, simply referred to as "wafer"). As an inspection device for performing such inspection, there is known one in which a probe card having probe needles to be in contact with semiconductor devices formed on the wafer is disposed to be opposite to a stage (chuck top) for attracting and holding the wafer and the probe card presses the wafer on the stage to bring contact probes of the probe card into contact with electrodes of the devices and inspect electrical characteristics of the devices (see, e.g., Patent Document 1).

Recently, it is required to inspect a large number of semiconductor wafers at a high speed. Therefore, there is suggested an inspection system including a plurality of inspection devices, an accommodating container where a plurality of wafers is accommodated, and a transfer unit for transferring a wafer from the accommodating container to each inspection device (see, e.g., Patent Document 2).

However, in the inspection device or the inspection system, a temperature of the wafer or temperature distribution of the wafer is important particularly when high-temperature inspection or low-temperature inspection is performed. Thus, the temperature of the stage surface is measured by a contact-type or a non-contact-type thermometer before the inspection is started.

Although it is not an example of the apparatus for inspecting devices, Patent document 3 discloses therein an inspection device for a solar cell module which includes a device for shielding the solar cell module and a device for detecting a temperature of the solar cell module in a shielded state. At this time, a thermal paper, a label coated with paint whose color changes depending on temperature changes, or the like is used as the temperature detecting device.

PRIOR ART

Patent document 1: Japanese Patent Application Publication No. 2004-140241
Patent document 2: Japanese Patent Application Publication No. 2013-254812
Patent document 3: Japanese Patent Application Publication No. 2001-24204

However, in the case of measuring the temperature of the stage surface by the contact-type or the non-contact-type thermometer, the measuring should be performed in a state where the apparatus stops and, thus, a throughput is decreased. In addition, since the actual wafer temperature is not measured, the measurement accuracy is not necessarily high.

The technique disclosed in Patent Document 3 is highly accurate because the inspection device having the temperature detecting device is directly attached to a temperature measurement object. However, in the case of applying this technique to the inspection of the devices, the measuring also should be performed in a state where the apparatus stops.

By installing an infrared camera at the inspection system, the temperature can be measured on line without stopping the apparatus. Since, however, a new equipment design is required, the cost is increased.

Therefore, in view of the above, the present invention provides an inspection system capable of highly accurately measuring a temperature of an inspection target substrate on line without using a new equipment, and a temperature measurement method for the inspection system.

SUMMARY

In accordance with a first aspect of the present invention, there is provided an inspection system including: at least one inspection device having a stage on which a substrate is mounted and configured to inspect the substrate on the stage; a temperature control mechanism configured to control a temperature of the stage; a substrate accommodating part configured to accommodate the substrate; a temperature measurement substrate standby part configured to making a temperature measurement substrate to be mounted on the stage wait; a transfer unit configured to transfer the substrate accommodated in the substrate accommodating part and the temperature measurement substrate waiting at the temperature measurement substrate standby part onto the stage; and a camera used for aligning the substrate on the stage. The temperature measurement substrate has a temperature measurement member whose state changes depending on a temperature on a surface of the temperature measurement substrate. The temperature measurement substrate is transferred from the temperature measurement substrate standby part onto the stage by the transfer unit, and the camera images the temperature measurement member so that a temperature of the temperature measurement substrate is measured from a change in the state of the temperature measurement member.

In accordance with a second aspect of the present invention, there is provided a temperature measurement method for an inspection system including at least one inspection device having a stage on which a substrate is mounted and configured to inspect the substrate on the stage; a temperature control mechanism configured to control a temperature of the stage; a substrate accommodating part where the substrate is accommodated; a transfer unit configured to transfer the substrate accommodated in the substrate accommodating part onto the stage; and a camera used for aligning the substrate on the stage. The temperature measurement method includes making a temperature measurement substrate having on a surface thereof a temperature measurement member whose state changes depending on a temperature wait; transferring the temperature measurement substrate onto the stage by the transfer device at a predetermined timing; and allowing the camera to image the temperature measurement member and measuring a temperature of the temperature measurement substrate from a change in the state of the temperature measurement member.

In the first aspect and the second aspect, the at least one inspection device may include two or more inspection devices, and the transfer device transfers the substrate and the temperature measurement substrate onto chuck tops of inspection devices.

The temperature measurement substrate may have the same shape as a shape of the substrate. Further, the temperature measurement member may be provided on a base of the temperature measurement substrate. In this case, a material and a thickness of the base may be adjusted such that a heat capacity of the temperature measurement substrate becomes close to a heat capacity of the substrate and the base may be made of the same material as a material of the substrate.

The camera may image at least one temperature measurement portion of the temperature measurement member. The at least one temperature measurement portion of the temperature measurement member may include two or more temperature measurement portions, and the camera may image the temperature measurement portions to measure temperature distribution of the temperature measurement substrate.

A color of the temperature measurement member may be changed depending on a temperature. Further, the temperature measurement member may be made of a temperature indicating material whose color changes reversibly at a certain temperature.

The temperature measurement member may be formed by laminating a plurality of transparent sheets having predetermined patterns of color developing materials that develop colors by reaction at a predetermined temperature such that positions and reaction temperatures of the color developing materials of the transparent sheets are different from each other. Temperature data may be obtained by allowing the camera to recognize a difference in the positions or the number of the patterns due to a temperature difference by using pattern matching.

The temperature measurement member may be formed by laminating a plurality of transparent sheets having predetermined patterns of the same color developing materials that develop colors by reaction at a predetermined temperature such that positions of the color developing materials of the transparent sheets are different from each other. Temperature data may be obtained by allowing the camera to recognize a difference in the positions or the number of the patterns due to a temperature difference based on the positions of the transparent sheets by using pattern matching.

In accordance with the aspects of the present invention, the temperature measurement substrate can be transferred onto the stage of the inspection device by the transfer unit as in the case of a normal substrate, and the surface temperature of the temperature measurement substrate can be measured by the alignment camera. Therefore, the temperature of the substrate can be measured on line without stopping the system. In addition, since the surface temperature of the temperature measurement substrate that simulates the substrate is measured, the temperature of the substrate on the stage can be measured with high accuracy. Further, since the temperature can be measured by the alignment camera that has been installed at the system, the existing equipment is sufficient and the cost is not increased.

DETAILED DESCRIPTION

Hereinafter, embodiments will be described in detail with reference to the accompanying drawings.
<Inspection System>
First, an example of an overall configuration of an inspection system according to an embodiment of the present invention will be described.

Figure 1:
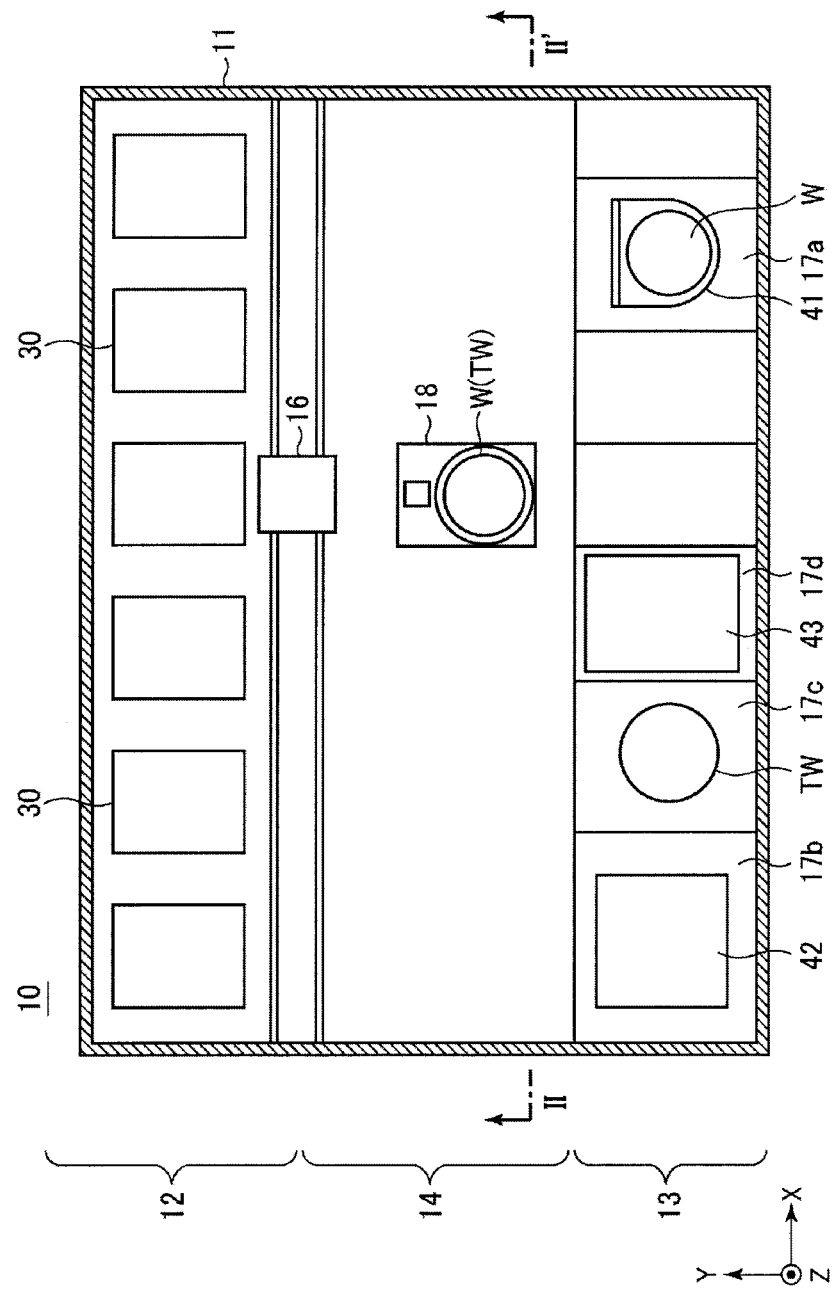
FIG. 1 is a horizontal cross-sectional view schematically showing an exemplary configuration of an inspection system according to an embodiment of the present invention.
Figure 2:
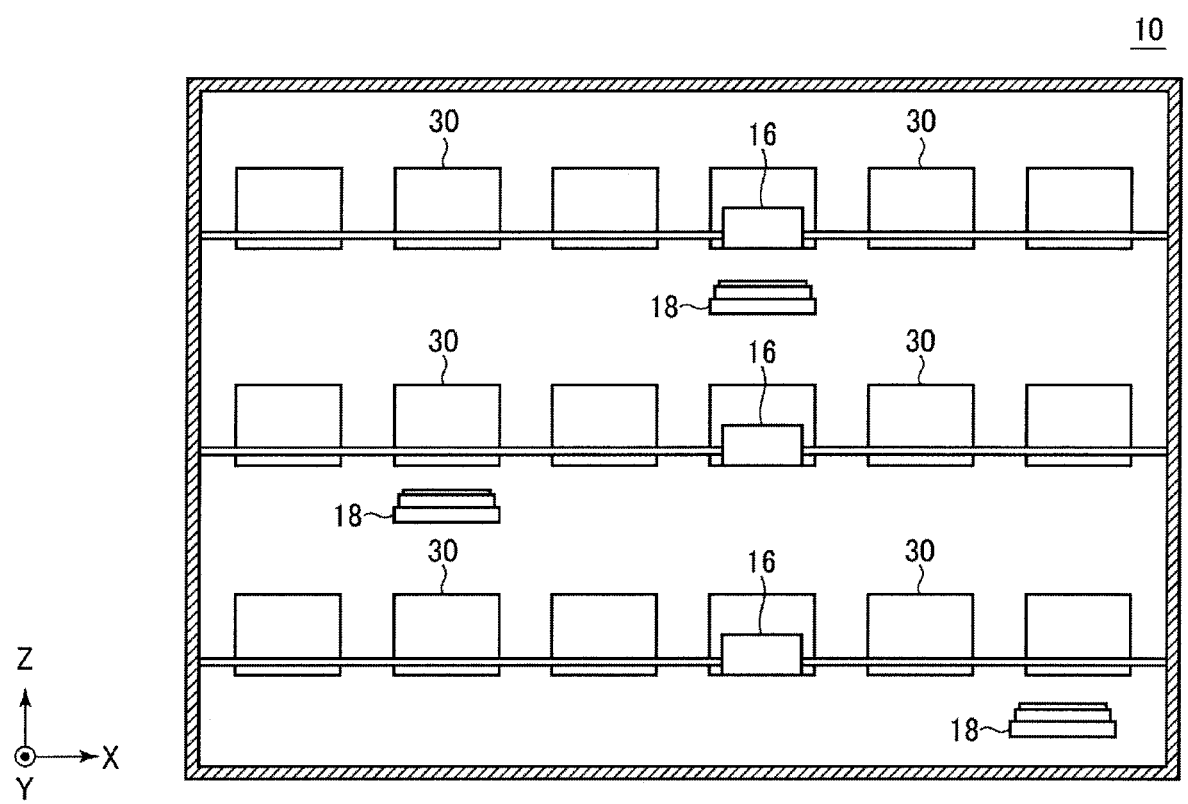
FIG. 2 is a longitudinal cross-sectional view taken along a line II-II' of FIG. 1.

FIG. 1 is a horizontal cross-sectional view schematically showing an exemplary configuration of an inspection system according to an embodiment of the present invention. FIG. 2 is a longitudinal cross-sectional view taken along a line II-II' of FIG. 1.

Referring to FIGS. 1 and 2, an inspection system 10 includes a housing 11 having therein an inspection region 12 for inspecting electrical characteristics of semiconductor devices on a wafer W, a loading/unloading region 13 for loading/unloading the wafer W into/from the inspection region 12, and a transfer region 14 disposed between the inspection region 12 and the loading/unloading region 13.

In the inspection region 12, inspection device rows in each of which a plurality of (six in this example) inspection devices (probers) 30 is arranged along the X direction are arranged in three stages along the Z direction (vertical direction). In addition, an alignment upper camera 16 for recognizing a position of the wafer W or the like is provided to correspond to each inspection device row. The upper camera 16 moves horizontally along the inspection device row corresponding thereto.

The loading/unloading region 13 is partitioned into multiple ports including a wafer loading/unloading port 17a accommodating therein a container, e.g., a FOUP 41, where a plurality of wafers W is stored; a loader port 17b accommodating a loader 42 into/from which a probe card 23 is loaded/unloaded; a temperature measurement wafer standby port 17c for making a temperature measurement wafer (temperature measurement substrate) TW that simulates the wafer W wait; and a control unit accommodating port 17d accommodating a control unit 43 for controlling operations of the respective components of the inspection system 10.

One or more temperature measurement wafers TW may be made to wait in advance at the temperature measurement wafer standby port 17c. Alternatively, the temperature measurement wafer TW may be inserted from the outside into the temperature measurement wafer standby port 17c at temperature measurement timing and made to wait.

A transfer unit 18 capable of moving along the X direction is disposed in the transfer region 14. Three transfer units 18 are provided to correspond to the inspection device rows. A wafer W is transferred from the FOUP 41 of the wafer loading/unloading port 17a in the loading/unloading region 13 to each inspection device 30, and a wafer W whose electrical characteristics are inspected is transferred from the corresponding inspection device 30 to the FOUP 41 of the wafer loading/unloading port 17a. Further, the transfer unit 18 transfers the temperature measurement wafer TW from the temperature measurement wafer standby port 17c in the loading/unloading region 13 to each inspection device 30 at the temperature measurement timing, and transfers the temperature measurement wafer to the standby port 17c after the temperature measurement. Further, the transfer unit 18 transfers a probe card requiring maintenance from each inspection device 30 to the loader 42 of the loader port 17b and transfers a new probe card or a probe card after the maintenance to each inspection device 30.

The control unit 43 includes a main controller having a CPU (computer) and configured to control the respective components of the inspection system 10, e.g., the respective parts of each inspection device 30, the transfer unit 18, and the like, an input device (keyboard, mouse, or the like), an output device (printer or the like), a display device (display or the like), and a storage device (storage medium). The main controller of the control unit 43 causes the inspection system 10 to execute a predetermined operation based on, e.g., a processing recipe stored in a storage medium built in the storage device or in a storage medium set in the storage device.

Figure 3:
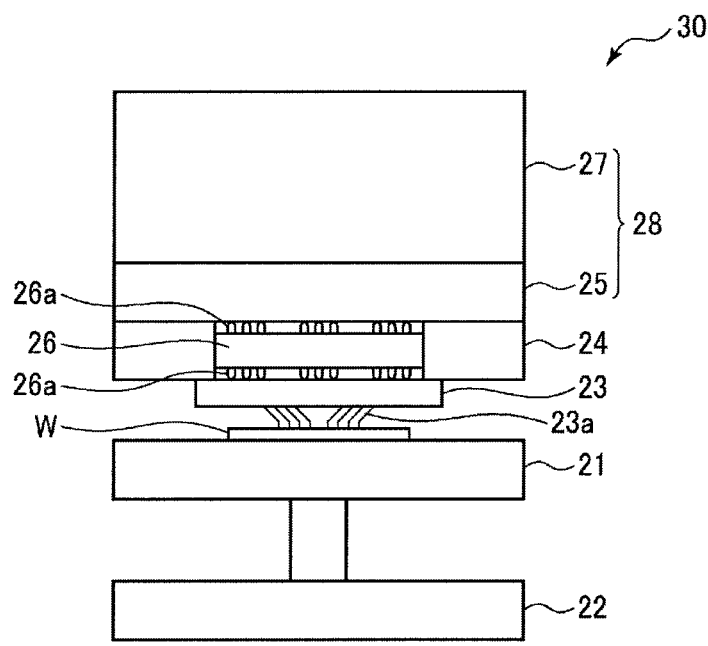
FIG. 3 schematically shows an inspection device.

As shown in FIG. 3, the inspection device 30 includes a chuck top (stage) 21 configured to attract and hold the wafer W by vacuum attraction and control a temperature of the wafer W; an aligner 22 configured to move the chuck top 21 in the X, Y, Z, and θ directions using an X-Y table mechanism, a Z-direction moving mechanism, and a θ-direction moving mechanism (all not shown) to position the wafer W at a predetermined position; a probe card 23 disposed opposite to the chuck top 21; a support plate 24 configured to support the probe card 13; a tester motherboard 25 disposed on the support plate 24; and a contact block 26 that connects the probe card 23 and the tester motherboard 25.

The tester motherboard 25 and a test head 27 constitute a tester 28. The probe card 23 has a plurality of probes 23a to be in contact with electrodes of multiple devices formed on the wafer W. A plurality of pogo pins 26a that electrically connects the probe card 23 and the tester motherboard 25 is disposed on an upper surface and a bottom surface of the contact block 26.

Electrical signals are transmitted from a tester module board (not shown) in the test head 27 to the devices on the wafer W through the tester motherboard 25 and the probes 23a of the probe card 23, and return to the tester module board. Accordingly, the electrical characteristics of the devices are inspected.

When the inspection is performed in a state where the probes 23a are in contact with the electrodes of the devices formed on the wafer W, an inspection space between the support plate 24 and the chuck top 21 is sealed with a sealing member or a bellows. By depressurizing the inspection space, the chuck top 21 may be adhered to the support plate 24. In that case, one aligner 22 may be shared by a plurality of inspection devices 30 in each inspection device row. The aligner 22 is provided with a lower camera (not shown) for recognizing the probe card 23.

The inspection system 10 configured as described above performs an operation of transferring the wafer W from the wafer loading/unloading port 17a to each inspection device 30 using the transfer unit 18 and an operation of returning the wafer W whose electrical characteristics are inspected to return to the wafer loading/unloading port 17a using the transfer unit 18 simultaneously and continuously.

Then, at a predetermined timing, the temperature measurement wafer TW is transferred from the temperature measurement wafer standby port 17c onto the chuck top 21 of the inspection device 30 by the transfer unit 18, and the surface temperature of itself is measured as will be described later. After the temperature measurement, the temperature measurement wafer TW is returned to the temperature measurement wafer standby port 17c by the transfer unit 18. At this time, the temperature measurement may be performed on a chuck top 21 of a specific inspection device 30, or may be performed on the chuck tops 21 of all the inspection devices 30 continuously.

By performing the temperature measurement using the temperature measurement wafer TW at appropriate timing, the temperature of the wafer W on the chuck top 21 can be measured on line.

<Temperature Measurement Wafer>

Next, the temperature measurement wafer TW will be described.

Figure 4:
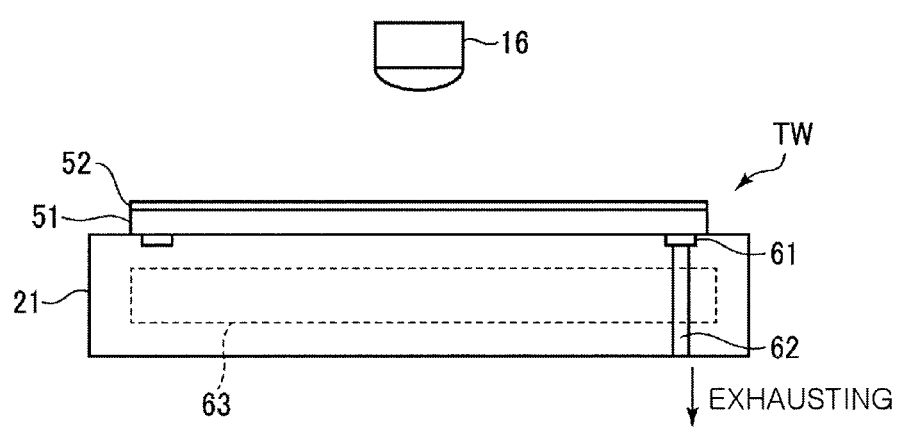
FIG. 4 is a cross-sectional view showing a state in which a temperature measurement wafer is mounted on a chuck top.

FIG. 4 is a cross-sectional view showing a state in which the temperature measurement wafer TW is mounted on the chuck top 21.

An annular vacuum attraction groove 61 is formed at a peripheral portion of the chuck top 21. A gas exhaust channel 62 is disposed in the vacuum attraction groove 61 to penetrate through the chuck top 21. The temperature measurement wafer TW is attracted by performing evacuation using a vacuum pump (not shown) through the gas exhaust channel 62. When the inspection is performed, the wafer W as an inspection object is also vacuum-attracted.

A temperature adjustment mechanism 63 is disposed in the chuck top 21, so that the inspection can be performed at a predetermined temperature. A heater is used as the temperature adjustment mechanism 63 when the inspection is performed at a high temperature up to about 120° C., and a coolant circulating mechanism is used as the temperature adjustment mechanism 63 when the inspection is performed at a low temperature of about −40° C. to −20° C. The temperature may be adjusted even when the inspection is performed at a room temperature. In the case of adjusting the temperature, it is important to check the temperature of the wafer W on the chuck top 21.

Therefore, in the present embodiment, the temperature measurement wafer TW is mounted on the chuck top 21 and the temperature thereof is measured. The temperature measurement wafer TW of the present embodiment has a plate-shaped base 51 and a temperature measurement member 52 formed on the base 51. A state of the temperature measurement member 52 changes depending on a temperature. The temperature measurement member 52 is imaged by the alignment upper camera 16 for recognizing the position of the wafer W or the like, and the temperature can be measured from the change in the state of the temperature measurement member 52.

The temperature measurement wafer TW preferably has a disk shape similar to that of wafer W. The temperature measurement wafer TW may have approximately the same size as that of the chuck top 21. The temperature measurement member 52 may be disposed on the entire surface of the base 51, or may be disposed only at a temperature measurement portion where the temperature is actually measured by the upper camera 16.

Figure 5:
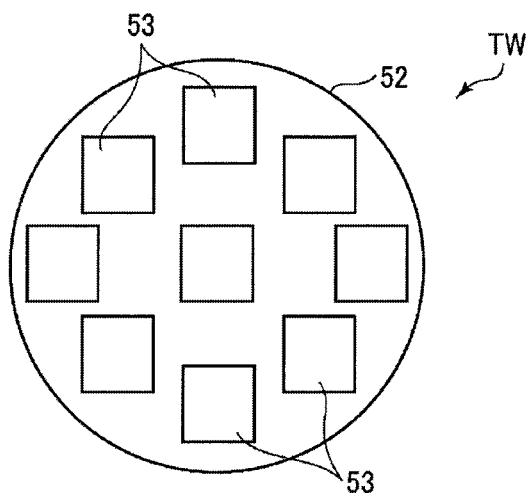
FIG. 5 shows a state in which a plurality of temperature measurement portions is disposed on a temperature measurement member.

The temperature measurement portion may be formed at only one location. However, when the temperature measurement portions are formed at multiple locations as shown in FIG. 5, the in-plane temperature distribution of the wafer can be obtained. In the example shown in FIG. 5, the temperature measurement portions 53 are formed at nine locations including the center and eight peripheral portions. When the temperature measurement portions 53 are formed at multiple locations, the upper camera 16 may sequentially image the temperature measurement portions 53 to measure the temperature.

As the temperature measurement member 52, it is possible to use Thermo label, Thermo sheet, or Thermo paint (all being registered trademarks of Nichiyu Giken Kogyo Corporation) using a material whose color changes depending on a temperature, or a temperature indicating material whose color changes reversibly at a certain temperature. Since temperature data is obtained from colors, it is preferable to use a color camera as the upper camera 16.

Figure 6:
FIG. 6 is a cross-sectional view showing a temperature measurement wafer using a temperature measurement member formed by laminating a plurality of transparent sheets having predetermined patterns (dots) of color developing materials 55 that develop colors by reaction at a predetermined temperature such that positions and reaction temperatures of the color developing materials of the transparent sheets are different from each other.
Figure 7:
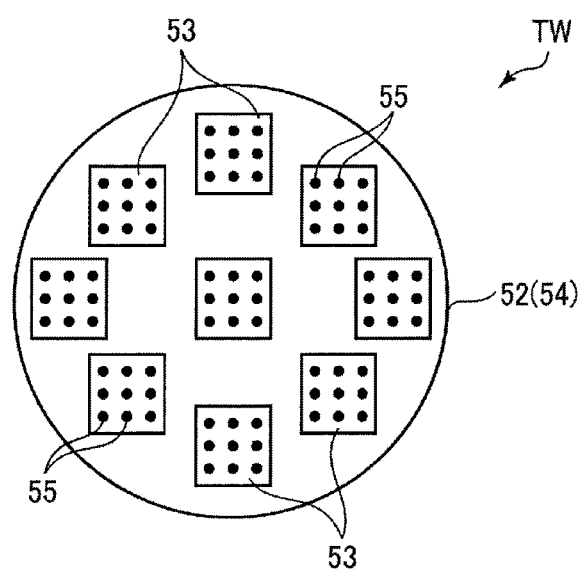
FIG. 7 is a plan view showing an example of the temperature measurement member formed by laminating the transparent sheets having the predetermined patterns (dots) of the color developing materials 55 that develop colors by the reaction at the predetermined temperature such that positions of the color developing materials of the transparent sheets are different from each other.

As the temperature measurement member 52, it is also possible to use one formed by laminating the transparent sheets 54 having predetermined patterns (e.g., dots) of the color developing materials 55 that develop colors by reaction at a predetermined temperature such that positions and reaction temperatures of the color developing materials 55 of the transparent sheets are different from each other as shown in FIG. 6. For example, as shown in FIG. 7, the temperature data can be obtained by setting the positions of the patterns (dots) of the color developing materials 55 of each of the transparent sheets 54 to be different at the temperature measurement portions 53 and recognizing the difference in the positions or the number of the patterns due to the temperature difference by using pattern matching. Even when the transparent sheets 54 having the same material are laminated, the temperature data can be obtained by the temperature difference due to the difference in the positions of the transparent sheets 54 in the laminating direction by using the same pattern matching. At this time, since it is only necessary to recognize whether or not the color develops, a black-and-white camera may be used as the upper camera 16.

The material and the thickness of the base 51 are preferably adjusted such that the temperature measurement wafer TW has a heat capacity close to that of the wafer W. If the temperature measurement member 52 is thin, the heat capacity of the temperature measurement wafer TW is close to that of the base 51. The base 51 is preferably made of the same material (typically, silicon) as that of the wafer W.

Since the temperature measurement wafer TW can be transferred onto the chuck top 21 of the inspection device 30 by the transfer unit 18 as in the case of the normal wafer W and the surface temperature of the temperature measurement wafer TW can be measured by the alignment upper camera 16 for alignment, the temperature of the wafer W can be detected on line without stopping the apparatus (system). Further, since the surface temperature of the temperature measurement wafer TW that simulates the wafer W is measured, the temperature of the wafer on the chuck top 21 can be detected with high accuracy. Furthermore, since the temperature can be measured by the alignment upper camera 16 that has been installed at the system, the existing equipment is sufficient and the cost is not increased.

By forming the temperature measurement portions on the temperature measurement wafer TW on the chuck top 21 and measuring the temperature, the in-plane temperature distribution of the wafer W on the chuck top 21 can also be obtained.

The temperature of the wafer W on the chuck top 21 can be detected with higher accuracy by adjusting the material or the thickness of the base 51 of the temperature measurement wafer TW to make the heat capacity of the temperature measurement wafer TW close to that of the wafer W.

<Other Applications>

While the embodiment of the present invention has been described, the present invention is not limited thereto, and can be variously modified without departing from the gist of the present invention.

For example, the above embodiment has described the case where the present invention is applied to the inspection system including a plurality of inspection devices. However, the present invention is not limited thereto, and may be applied to an inspection system including a single inspection device.

The above-described embodiment has described an example in which the temperature measurement member having a material whose color changes or a color developing material that develops a color depending on a temperature is used as the temperature measurement wafer. However, the present invention is not limited thereto, and a shape or the like may change depending on a temperature.

DESCRIPTION OF REFERENCE NUMERALS

10: inspection system
16: upper camera
17a: wafer loading/unloading port (substrate accommodating part)
17c: temperature measurement wafer standby port (temperature measurement substrate standby part)
18: transfer unit
21: chuck top
23: probe card
23a: probe
30: inspection device
51: base
52: temperature measurement member
53: temperature measurement portion
54: transparent sheet
55: color developing material
63: temperature adjustment mechanism
TW: temperature measurement wafer (temperature measurement substrate)
W: semiconductor wafer (substrate)

The invention claimed is:
1. An inspection system comprising:
at least one inspection device having a stage on which a substrate is mounted and configured to inspect the substrate on the stage;
a temperature control mechanism configured to control a temperature of the stage;
a substrate accommodating part configured to accommodate the substrate;
a temperature measurement substrate standby part configured to making a temperature measurement substrate to be mounted on the stage wait;
a transfer unit configured to transfer the substrate accommodated in the substrate accommodating part and the temperature measurement substrate waiting at the temperature measurement substrate standby part onto the stage; and a camera used for aligning the substrate on the stage, wherein the temperature measurement substrate has a temperature measurement member whose state changes depending on a temperature on a surface of the temperature measurement substrate, and the temperature measurement substrate is transferred from the temperature measurement substrate standby part onto the stage by the transfer unit, and the camera images the temperature measurement member so that a temperature of the temperature measurement substrate is measured from a change in the state of the temperature measurement member.

2. The inspection system of claim 1, wherein the at least one inspection device includes two or more inspection devices, and the transfer device transfers the substrate and the temperature measurement substrate onto stages of inspection devices.

3. The inspection system of claim 1, wherein the temperature measurement substrate has the same shape as a shape of the substrate.

4. The inspection system of claim 1, wherein the temperature measurement member is provided on a base of the temperature measurement substrate.

5. The inspection system of claim 4, wherein a material and a thickness of the base are adjusted such that a heat capacity of the temperature measurement substrate becomes close to a heat capacity of the substrate.

6. The inspection system of claim 5, wherein the base is made of the same material as a material of the substrate.

7. The inspection system of claim 1, wherein the camera images at least one temperature measurement portion of the temperature measurement member.

8. The inspection system of claim 7, wherein the at least one temperature measurement portion of the temperature measurement member includes two or more temperature measurement portions, and the camera images the temperature measurement portions to measure temperature distribution of the temperature measurement substrate.

9. The inspection system of claim 1, wherein a color of the temperature measurement member changes depending on a temperature.

10. The inspection system of claim 1, wherein the temperature measurement member is made of a temperature indicating material whose color changes reversibly at a certain temperature.

11. The inspection system of claim 1, wherein the temperature measurement member is formed by laminating a plurality of transparent sheets having predetermined patterns of color developing materials that develop colors by reaction at a predetermined temperature such that positions and reaction temperatures of the color developing materials of the transparent sheets are different from each other, and temperature data is obtained by allowing the camera to recognize, by using pattern matching, a difference in the positions or the number of the patterns due to a temperature difference.

12. The inspection system of claim 1, wherein the temperature measurement member is formed by laminating a plurality of transparent sheets having predetermined patterns of the same color developing materials that develop colors by reaction at a predetermined temperature such that positions of the color developing materials of the transparent sheets are different from each other, and temperature data is obtained by allowing the camera to recognize, by using pattern matching, a difference in the positions or the number of the patterns due to a temperature difference based on the positions of the transparent sheets.

* * * * *